US007298217B2

(12) United States Patent
Adlerstein et al.

(10) Patent No.: US 7,298,217 B2
(45) Date of Patent: Nov. 20, 2007

(54) PHASED ARRAY RADAR SYSTEMS AND SUBASSEMBLIES THEREOF

(75) Inventors: Michael G Adlerstein, Wellesley, MA (US); Valery S. Kaper, Winchester, MA (US)

(73) Assignee: Raytheon Company, Waltham, MA (US)

( * ) Notice: Subject to any disclaimer, the term of this patent is extended or adjusted under 35 U.S.C. 154(b) by 97 days.

(21) Appl. No.: 11/292,847

(22) Filed: Dec. 1, 2005

(65) Prior Publication Data

US 2007/0129040 A1 Jun. 7, 2007

(51) Int. Cl.
*H03L 7/00* (2006.01)

(52) U.S. Cl. .......................................... 331/12; 331/77
(58) Field of Classification Search .................. 331/12, 331/77
See application file for complete search history.

(56) References Cited

U.S. PATENT DOCUMENTS 5,568,098 A * 10/1996 Horie et al. .................. 331/16

FOREIGN PATENT DOCUMENTS

FR   2 542 930 A1   9/1984

OTHER PUBLICATIONS

Behzad Razavi, A Study of Injection Locking and Pulling in Oscillators. 2004, pp. 1415-1424, Department of Electrical Engineering, University of California, Los Angeles, CA 90095.
A.S. Daryoush, M. Francisco, R. Saedi, D. Polifko, R. Kunath, Phase Control of Optically Injection Locked Oscillators for Phased Arrays, 1990, pp. 1247-1250, Drexel University, Philadelphia, PA 19104.
Xiangdong Zhang, Afshin S. Daryoush, Full 360 Phase Shifting of Injection-Locked Oscillators, 1993, pp. 14-16, vol. 3, No. 1, Drexel University, Philadelphia, PA 19104.
Hossein Hashemi, Xiang Guan, Abbas Komijani, Ali Hajimiri, A 24-GHZ SiGe Phased-Array Receiver-LO Phase-Shifting Approach, 2005, pp. 614-626, vol. 53, No. 2, Department of Electrical Enginering, California Institute of Technology, Pasadena, CA 91125.
PCT Search Report and Written Opinion of the ISA for PCT/US 2006/043485 dated Apr. 5, 2007.

(Continued)

*Primary Examiner*—Joseph Chang
(74) *Attorney, Agent, or Firm*—Daly, Crowley, Mofford & Durkee, LLP (57) ABSTRACT

A phase shifter is fed an input signal having a frequency f. A coupler is included fed by the input signal. The coupler has a pair of output terminals for providing a pair of signals having the frequency f and having a relative phase shift difference of $m\pi/2$ radians, where m is an integer. A switch is included having a pair of inputs, each one of the pair of inputs being coupled to a corresponding one of the pair of output terminals of the coupler. The switch has an output, one of the pair of inputs of the switch being coupled to the output of the switch selectively in accordance with a first control signal fed to the switch. An oscillator is included having a tunable resonant circuit coupled to the output of the switch, such tunable resonant circuit has a nominal resonant frequency which is an integer multiple of the frequency f, the frequency of the resonant circuit being detuned from the nominal resonant frequency in response to a second control signal fed to the tunable resonant circuit to shift the nominal resonant frequency relative to the a harmonic of the signal at the output of the switch.

8 Claims, 3 Drawing Sheets

OTHER PUBLICATIONS

Hall, P. S. et al,; "Beamforming in quasi-optic active arrays using subharmonic locking"; IEE Colloquium ON Novel Techniques For Antenna Beam Control, (Digest No. 1995/003), 1995, pp. 4/1-4/3, IEE, London, UK.

Hall, P. S. et al,; "Microstrip Active Patch Array With Beam Scanning"; Electronics Letters, IEE Stevenage, GB, vol. 28, No. 22, Oct. 22, 1992, pp. 2056-2057.

* cited by examiner

PHASED ARRAY RADAR SYSTEMS AND SUBASSEMBLIES THEREOF

TECHNICAL FIELD

This invention relates generally to phased array radar system and subassemblies therefor and more particularly to beam forming transmit and receive elements used therein and adapted for integrated circuit fabrication

BACKGROUND

As is known in the art, microwave phased array elements which incorporate electronic phase shifters have a wide variety of applications. One such application is in phased array systems. More particularly, beam forming apparatus is used to form beams of electromagnetic radiation. The shape of the beam is related to the phase and amplitude distributions provided to signals received or transmitted across an aperture of the apparatus. For example, in a phased array antenna, the aperture includes a plurality of antenna elements. Each one of the antenna elements is coupled to a feed structure through a corresponding one of a plurality of variable phase shifter-variable gain modules. The feed structure may be a corporate feed or may be through illuminations as in a space fed phased array system. In any event, the modules are controlled by signals from a beam steering computer to provide a collimated and directed beam of radiation. For example, for a broadside (i.e., boresight) beam the phase shift of the signals emanating from each antenna element is zero relative to some arbitrary reference. If the phase shift from element to element differs by a fixed amount from zero, the direction of the main radiation lobe is shifted from broadside accordingly.

When used to transmit radar energy, transmitted pulses have a carrier frequency, $f_c$ and each module operates at this same frequency, $f_c$. Thus, for proper operation of the array, there must be a common reference frequency brought to each element through the feed structure.

As is also known in the art, it is desirable to have modules adapted for integrated circuit fabrication. Today, the amplifier sections of the modules are constrained for many applications to be constructed with III-V technology (e.g. GaAs, GaN, InP) materials. The phase shifter portions of the modules are most often monolithically constructed using discrete, switched phase shifters operating at the microwave frequency to be radiated. Recent advances in silicon CMOS technology have enabled implementation of phase shifting functions in an analog manner. Advantages include greater flexibility and lower cost for the phase shifting and frequency control of the array element. One technique suggested is described in an article entitled "Full 360° Phase Shifting of Injection-Locked Oscillators" by Xiangdong Zhang, published in "IEEE MICROWAVE AND GUIDED WAVE LETTERS, VOL. 3, NO. 1, JANUARY 1993. A shortcoming of this technique is the potential for unwanted frequency shift concurrent with beam steering. A further shortcoming is the omission of an efficient and flexible receive path as needed for radar application

SUMMARY

In accordance with the invention, a phase shifter is provided. The phase shifter is fed an input signal having a frequency f. A coupler is included fed by the input signal. The coupler has a pair of output terminals for providing a pair of signals having the frequency f and having a relative phase difference of $m\pi/2$ radians, where m is an integer. A switch is included having a pair of inputs, each one of the pair of inputs being coupled to a corresponding one of the pair of output terminals of the coupler. The switch has an output, one of the pair of inputs of the switch being coupled to the output of the switch selectively in accordance with a first control signal fed to the switch. Coupled to the output of the switch is a tunable resonant circuit. The tunable resonant circuit has a nominal resonant frequency which is an integer multiple of the frequency f, the frequency of the resonant circuit being detuned from the nominal resonant frequency in response to a second control signal fed to the tunable resonant circuit to shift the nominal resonant frequency relative to the a harmonic of the signal at the output of the switch.

In one embodiment, a frequency multiplier is included for multiplying the frequency, f/M, of a second signal by a factor M, where M is an integer, to produce the input signal having the frequency f.

In one embodiment, the frequency multiplier includes a phase locked loop, having: a phase detector having a first input fed by the second signal to the frequency multiplier; and an oscillator controlled by the phase detector for producing the input signal. The phase detector has a second input fed by a portion of the signal produced by the oscillator.

In one embodiment, the phase locked loop includes a frequency divider fed by a portion of the signal produced by the oscillator. The output of the frequency divider is fed to the second input of the phase detector. The frequency divider divides the frequency of the signal produced by the oscillator by the factor M.

In one embodiment, a transmit/receive module is provided. The module includes: (A) a transmit path having the phase shifter, and (B) a receive path having a mixer fed by power coupled from the transmit signal path.

In one embodiment, a phase shifter is provided having a frequency multiplier for converting the frequency, f/(2M), of an input signal, where M is an integer greater than one, to produce a first output signal having a frequency f/2; and a tunable resonant circuit coupled to the frequency multiplier for producing a second output signal having a nominal frequency nf/2, where n is an integer greater or equal to 1, the phase of the second output signal being detuned from its nominal phase in response to a control signal fed to the tunable resonant circuit.

In one embodiment, the phase shifter includes a hybrid junction having a pair of outputs for providing at one output a signal having a fixed 90 degree phase shift relative to a signal at the other one of the outputs, such hybrid junction having an input coupled to the frequency multiplier; and a switch for coupling one of the pair of outputs to the tunable resonant circuit selectively in accordance with a switch control signal.

With such an arrangement, i.e., using the frequency multiplier followed by the tunable resonant circuit, such as an injection locked oscillator or an amplifier, a phase shifter is provided that ensures that the frequency is held constant. The arrangement provides flexibility in choosing the up-conversion ratio by changing M and n—modulus of the frequency divider in the frequency multiplier. In the case where n=2, using a 90 degree hybrid and the switch in conjunction with the tunable resonant circuit provides a ±180 degrees of the phase shifting range as needed by a fully scannable phased array antenna application.

The invention provides the aforesaid architecture for a transmit phased array element which allows digital control of the beam direction without the need for a microwave beam forming network operating at the transmit frequency Much of the circuit can be implemented in CMOS circuitry since the functions are implemented at subharmonics of frequencies rationally related to the radiated frequency. The design allows for frequency control and multiplexing control with reference data.

In one embodiment, a receive path for a return signal uses one or more local oscillator signals derived from the transmit path having the same desired phase shift during both transmit and receive. The system thereby allows the option of single conversion to base band where analog to digital conversion can be implemented. Alternatively, double conversion can be implemented allowing for other detection schemes including in-phase (I) and quadrature (Q) phase processing. This embodiment allows for retention of the transmit beam pattern in the receive mode without the need to separately set the phases in the receive path.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
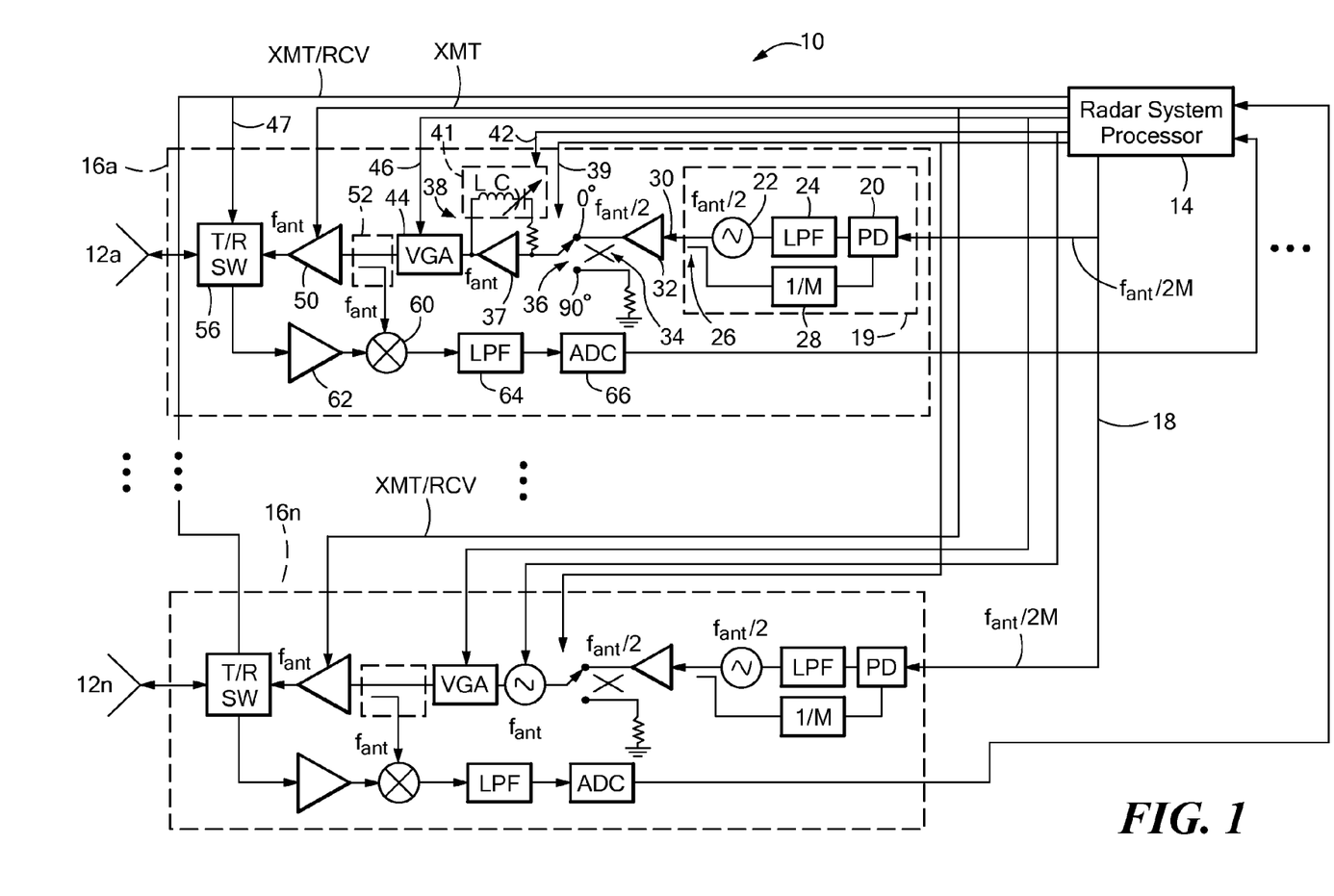
FIG. 1 is a block diagram of a radar system according to the invention.

Referring now to FIG. 1 a phased array radar system 10 is shown having an array of antenna elements 12a-12n coupled to a radar system processor 14 through a beam forming network. The beam forming network includes interfaces to a plurality of identical variable transmit/receive phase shifting and amplitude adjusting modules 16a-16n.

Each variable transmit/receive phase shifting and amplitude adjusting module 16a-16n includes a phase lock loop (PLL) 19 fed by a common reference frequency signal produced by the radar system processor 14 on line 18. The frequency of the signal on line 18 is represented as $f_s=f_{ant}/(2M)$, where M is an integer greater than one, typically a power of 2. Here, in this example, M=16 and $f_{ant}$ is 10 GHz. Thus, the reference signal on line 18 is 625 MHz. It should be noted that because of this relatively low frequency, the usual beam forming network can be replaced with conventional UHF transmission media (e.g. coax, printed traces or demodulated optical signals).

The PLL 19 includes a phase detector (PD) 20 fed by the reference signal on line 18 as well as a feedback signal derived from a master oscillator 22 to be described. The output of the phase detector 20 is fed to a low pass filter 24. The output of the low pass filter 24 is a DC signal used to control a voltage controlled oscillator 22. The output of the voltage controlled oscillator 22 has a nominal frequency of $f_{ant}/2$ (i.e., the nominal frequency $f_{ant}/2$ is produced when the level of the DC signal produced by the low pass filter 24 is zero). A portion of the output signal produced by the voltage controlled oscillator 22 is fed back to the phase detector 20 through a coupler 26 and a frequency divider 28. The frequency divider 28 divides the frequency, $f_{ant}/2$ of the feed back signal from the coupler 26 by the factor M producing a signal having the frequency $f_{ant}/(2M)$, where M is an integer. Thus, the PLL 19 provides a frequency multiplier for multiplying the frequency, $f_s$, of the reference signal on line 18 by a factor M, where M is an integer, to produce at the output 30 of the PLL 19 a signal having a frequency $f_s/2$.

The major portion of the output of the PLL 19 is fed to a buffer amplifier 32. The output of the buffer amplifier 32 is fed to a 90-degree hybrid junction 34. The hybrid junction 34 produces a pair of output signals as terminal 0° and 90°, such output signals are equal in amplitude and have a ninety degree phase difference therebetween.

The outputs of the hybrid junction 34 are fed to a switch 36. The switch 36 operates in response to a control signal produced by the radar system processor 14 on line 39. The control signal on line 39 has two DC states; in one state the control signal on line 39 operates the switch 36 to couple the signal at the terminal 0° to the input of an injection locked oscillator 38 to obtain phase variations from 0 degrees to 180 degrees while in the other state the control signal on line 39 operates the switch 36 to couple the signal at the terminal 90° to the input of an injection locked oscillator (ILO) 38 to obtain phase shift variations from 180 degrees to 360 degrees, for reasons to be explained below.

The injection locked (i.e., slave) oscillator 38 is voltage controlled by a signal produced by the radar system processor 14 on line 42. More particularly, the oscillator 38 includes an amplifier 37 having a tunable resonator circuit 41 (i.e., a capacitor, here variable capacitor (C)-inductor (L) resonant circuit) connected around it in a feedback relationship, as shown. It should be understood that tunable resonant circuit may take other forms such parallel resonant circuit, for example. The resonance of the tunable resonant circuit 41 is here controlled by a voltage on line 42 changing the capacitance of the variable capacitor C. The output of the injection locked oscillator 38 is fed to a variable gain amplifier 44 or attenuator, which gain, or attention, as the case may be, is controlled by a control signal (usually DC) produced by the radar system processor 14 on line 46. The output of the variable gain/attention device 44 is fed to a high power amplifier 50 though a coupler 52. The output of the amplifier has a frequency $f_{ant}$, and is, during transmit, fed through a transmit/receive switch 56 to the antenna element 12a in the case of module 16a, for example.

It is noted that the frequency produced by injection locked oscillator 38, sometimes herein referred to as a slave oscillator with oscillator 22 sometimes being referred to as a master oscillator) is twice that of the frequency produced by master oscillator 22. Therefore, the phase of slave oscillator 38 is referenced to the second harmonic of the master oscillator 22; this harmonic being produced by the inherent non-linearity of the slave oscillator 38. The phase of the slave oscillator 38 can be varied by +/−90 degrees relative to the reference phase (i.e., the second harmonic of the master oscillator 22). In one state, the reference phase is obtained with the switch 36 set to 0 degrees. In a vector representation, the output of the phase of the slave oscillator 38 output may be represented as a 180 degree semicircle. However, for operation of any phased array element, it is necessary that the phase be variable over a range of +/−180 degrees. The required adjoining semicircle to form a complete 360 circle is achieved by setting the switch 36 to the 90 degree polarity. This results in a 180 degree phase shift of the phase reference signal within the slave oscillator 38. Thus, every phase state available within the slave oscillator 38 has a counterpart of opposite polarity. The output phasor then covers the desired 360 degree range. To put it another way, when the signal at the terminal 0° is coupled to the input of an injection locked oscillator, slave, 38, phase shift variations from −90 degrees to +90 degrees are obtained at the output of slave oscillator 38 whereas when switch 36 couples the signal at the terminal 90° to the input of an injection locked oscillator (ILO), slave, 38 the phase shift variations increases from +90 degrees to +270 degrees at the output of slave oscillator 38.

It is noted that the T/R switch 56 is operated by a control signal produced by the radar system processor 14 on line 47. It is also noted that pulses of RF energy for transmission are generated by pulse modulation of the high power amplifier 50 responding to the XMT command signals from the radar system processor 14, for example.

A minor portion of the signal produced by the variable gain/attention device 44 is fed to a mixer 60 through the coupler 52. This signal acts as a local oscillator whose phase is controlled by the signal produced by the processor 14 control lines 39 and 42. Thus, during the receive mode, energy received by the antenna elements 12a-12n are fed to the mixer 60 in the corresponding module 16a-16 via an amplifier 62. The output of the mixer 60 is fed via low pass filter 64 back to the radar system processor 14 via an analog to digital converter 66, as indicated. Other detection schemes can be employed in base band including those involving quadrature detection (i.e., in-phase (I) and quadrature (Q) channels).

The shape of the beam provided by the antenna elements 12a-12n is related to the relative phase and amplitude distributions provided to input signal by the plurality of identical variable transmit/receive phase shifting and amplitude adjusting modules 16a-16n. It is noted that the reference signal on line 18 is used with a pair of voltage-controlled oscillators 22, 38, referred to as "master" and "slave", respectively. The reference signal on line 18 is fed to the phase detector 20 that is part of the master oscillator phase locked loop (PLL) circuit 19. The frequency divider and low pass filter (LPF) portion of the PLL serve to phase lock the master oscillator 22 in a conventional manner. This phase locking is accomplished by a loop input to a DC varactor, not shown, included in a resonant tank circuit, not shown of the oscillator 22 or any other means of injection locked oscillator phase control in the master oscillator tank circuit, not shown. The free running frequency of the master oscillator 22 is, in this example, $f_o/2$, here $f_o/2$ is 5 GHZ. The buffer amplifier 32 following the oscillator 22 provides power gain as well as a constant load for oscillator 22.

The combination of components comprising the master oscillator 22 is designed to maintain low phase noise and provide input to the compact quadrature hybrid coupler 34. As noted above, the two output terminals of the hybrid coupler 34 are equal in amplitude and 90 degrees different in phase. The switch 36 passes a signal at $f_{ant}/2$ to select the sense of the phase that is input to the slave oscillator 38.

It is noted that for a free running oscillator, the frequency of oscillation is determined such that the phase of the output signal results in optimal positive feedback to the input of the gain element. That phase is determined by the resonator present in the oscillator as well as the feedback path. If the resonator is tunable, as would be a varactor in combination with an inductor, the frequency varies in order to maintain the desired feedback phase. In an injection locked oscillator, a signal, here the signal from switch 36, is injected into the feedback path, i.e., the tunable resonate circuit 41, as in FIG. 1a.

Suppose that the injected signal is at the free running frequency. Then the oscillator phase will adjust such that the vector sum of the injected signal and the output signal will provide the desired feedback phase to sustain oscillation, as described in an article entitled "A study of locking phenomena in oscillators" by R. Adler, Proceeding of IRE vol. 34, pp. 351-357). Suppose further that the resonant frequency of the oscillator is changed by varying the varactor. Then, in order to sustain oscillation, the phase of the output signal will have to readjust to accommodate the phase shift through the retuned resonator 41. If the injected signal is strong enough, oscillator dynamics will prevent the frequency from shifting.

It can be shown that the phase shifting produced in this way is limited to +/−90 degrees while +/−180 degrees is required for beam steering. This problem is solved, as noted above, by providing the hybrid coupler 34 and switch 36.

According to the invention, the output of the switch 36 is a signal having a frequency $f_{ant}/2$ and is injected directly into the slave oscillator 38. The oscillator 38 is itself a highly nonlinear device and thus generates a second harmonic signal internally which acts like an injected signal at the free running frequency. The injected signal results in subharmonic frequency locking to $f_{ant}$ of the slave oscillator 38.

Relative to the phase of the harmonic of the injected signal, the classical effect described above will allow a +/−90 degree phase shift. For any of these phase settings, an abrupt 90 degree phase shift of the reference signal corresponds to a 180 degree phase shift of the second harmonic. This will result in a 180 degree phase shift in the output signal from oscillator 38. This phase would not be accessible by simply varying the varactor tuner, i.e., the resonant 41. The abrupt 90 degree shift in the reference is due to switch selection of the opposite hybrid branch.

The voltage sensitivity of output variation will depend on the ratio of the injected input power from the master oscillator 22 to the output power from the slave oscillator 38. The Q of the resonator 41 in the slave oscillator 38 also plays a role in the voltage sensitivity of phase shift. Thus, there is also a trade-off between injected power, Q and phase noise.

The phase control voltage provided to the slave oscillator 38 on line 42 as well as the voltage used to operate the switch 36 on line 39 is provided by the radar system processor 14. One scheme is to use D/A conversion of data that is multiplexed onto the reference UHF signal on line 18. This data can control not only the phase of the rf signals (and hence the beam direction) but also can induce a frequency change. This would be accomplished by using various combinations of divider settings (i.e. the choice of M) in the phase locked loop, and sub harmonic number, n for frequency locking the slave oscillator 38.

In accordance with the above invention, the phase shifting operation is provided by the frequency multiplier, here the PLL 19, having the master oscillator 22, for converting the frequency, $f_{ant}/(2M)$, of the reference signal, where M is an integer greater than one (usually a power of 2), to a first output signal having a frequency $f_{ant}/2$. The slave oscillator 38 is coupled to the frequency multiplier and produces an output signal having a nominal frequency $nf_{ant}/2$, where n is an integer greater than one, here n is two, the phase of the output signal being detuned from its nominal phase in response to a control signal fed to the slave oscillator 38 via line 42.

In the phased array what is important is the ability to steer the beam at the frequency of $f_{ant}$, meaning to be possible to introduce relative phase shift between the array antenna elements 12a-12n relative to a zero phase of a certain antenna element. For example, consider that antenna element 12a transmits at some phase define as the reference phase. The next antenna element 12b, not shown, is at the frequency of $f_{ant}$ and has its phase adjusted by the module 12b, not shown (injection-lock oscillator ILO 42 with the switch 36 and the hybrid 36) to have a phase X relative to that of the antenna element 12a. The next antenna element 12c, not shown has a phase shift is 2X again relative to the antenna element 12a phase. And so on so that antenna element 12n has a phase shift nX relative to the antenna element 12a. The signal on line 18 of frequency $f_{ant}/(2M)$ serves as a common reference signal. In this arrangement, it is important to understand the magnitude of the instantaneous phase uncertainty between the antenna elements 12a-12n in the array at $f_{ant}$. Due to the upconversion process in the PLL 19 and ILO 38, this uncertainty (or phase error) is 2M*delta phi common, where delta phi common is the phase error between inputs to the antenna elements 12a-12n at the frequency of $f_{ant}/(2M)$. The system uses an initial calibration of the array to account for such systematic errors.

Considering now the receive operation, in the receive mode, the T/R switch 56 connects the antenna elements 12a-12n in modules 16a-16n to the corresponding receive path in such module 16a-16n. The slave oscillator 38 in the transmit chain acts as a local oscillator (LO) for a direct conversion mixer 60 in the receive path. The antenna element-to-antenna element phase relations of the received signal are preserved in the conversion. Hence the direction of the antennal lobe is the same as the transmit lobe direction since the LO phases are derived from the same phase shifting module 16a-16n as during transmit. The mixer 60 is designed to provide isolation between the LO and RF ports in both directions. A very good output match for the low noise amplifier 62 supplements this isolation.

Another requirement of the up-conversion in the receive chain is that the LO phases into the mixer 60 be coherent, antenna element-to-antenna element. This requirement is addressed by the same mechanism at work in the transmit mode as described above. If the mixers introduce any element-to-element phase shift, the phase of the slave oscillator 38 can be readjusted upon transition from the transmit mode to the receive mode in order to preserve the beam direction.

Figure 2:
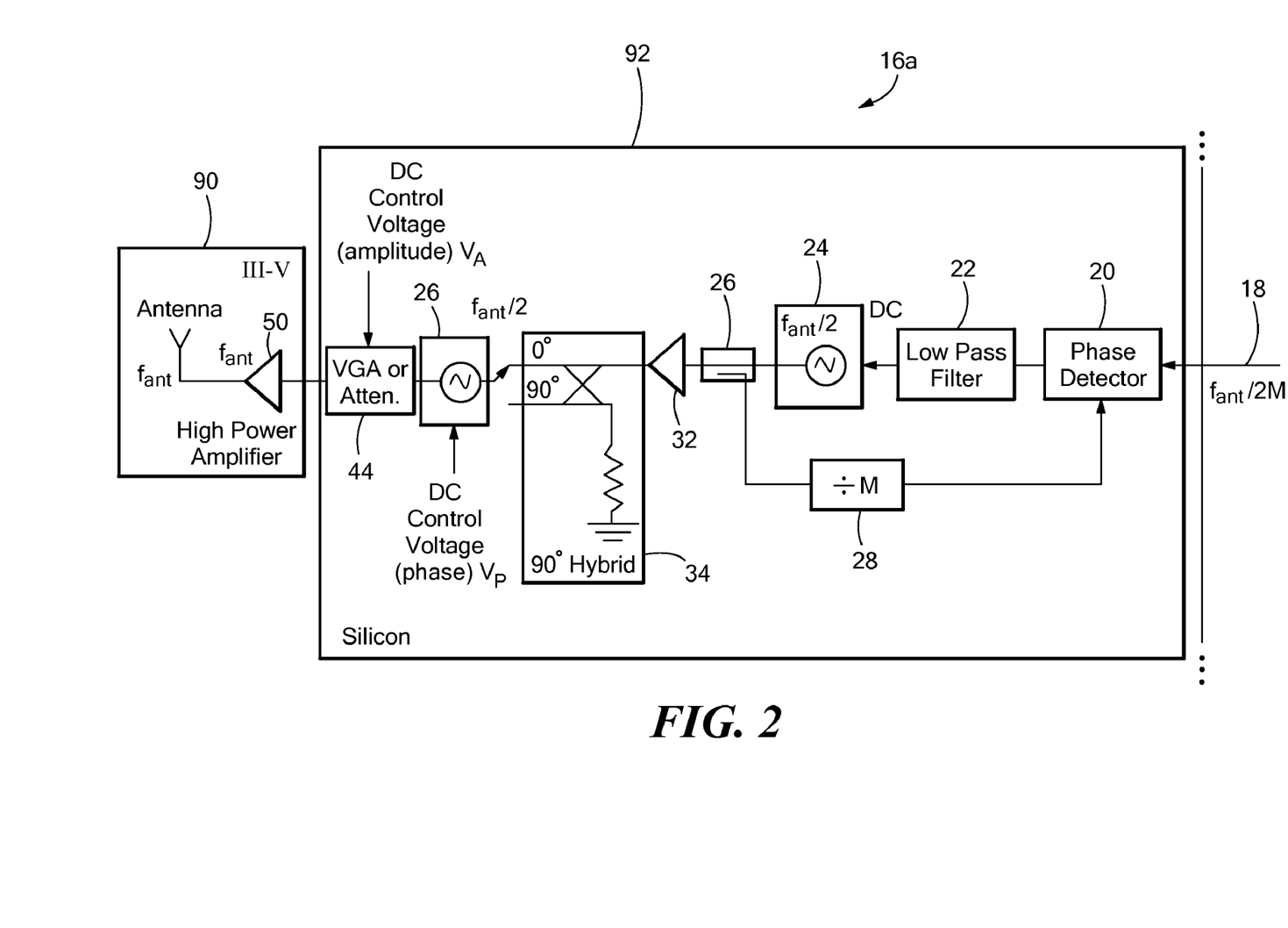
FIG. 2 is a block diagram of a transmit portion of an exemplary one of a plurality of identical variable transmit/ receive phase shifting and amplitude adjusting elements used in the radar system of FIG. 1 according to the invention.

Referring now to FIG. 2, the transmit section of the module shown in FIG. 1 is. shown in a two-chip implementation: one chip 92 is silicon suitable for CMOS fabrication, and the other chip 90 uses a III-V material optimized for RF performance. Thus, such an arrangement allows digital control of the beam direction, eliminates the need for a microwave beam former, and much of the circuit can be implemented in CMOS circuitry since the functions are implemented at subharmonics of the radiated frequency. The design allows for frequency control and multiplexing control through radar system commands.

Figure 3:
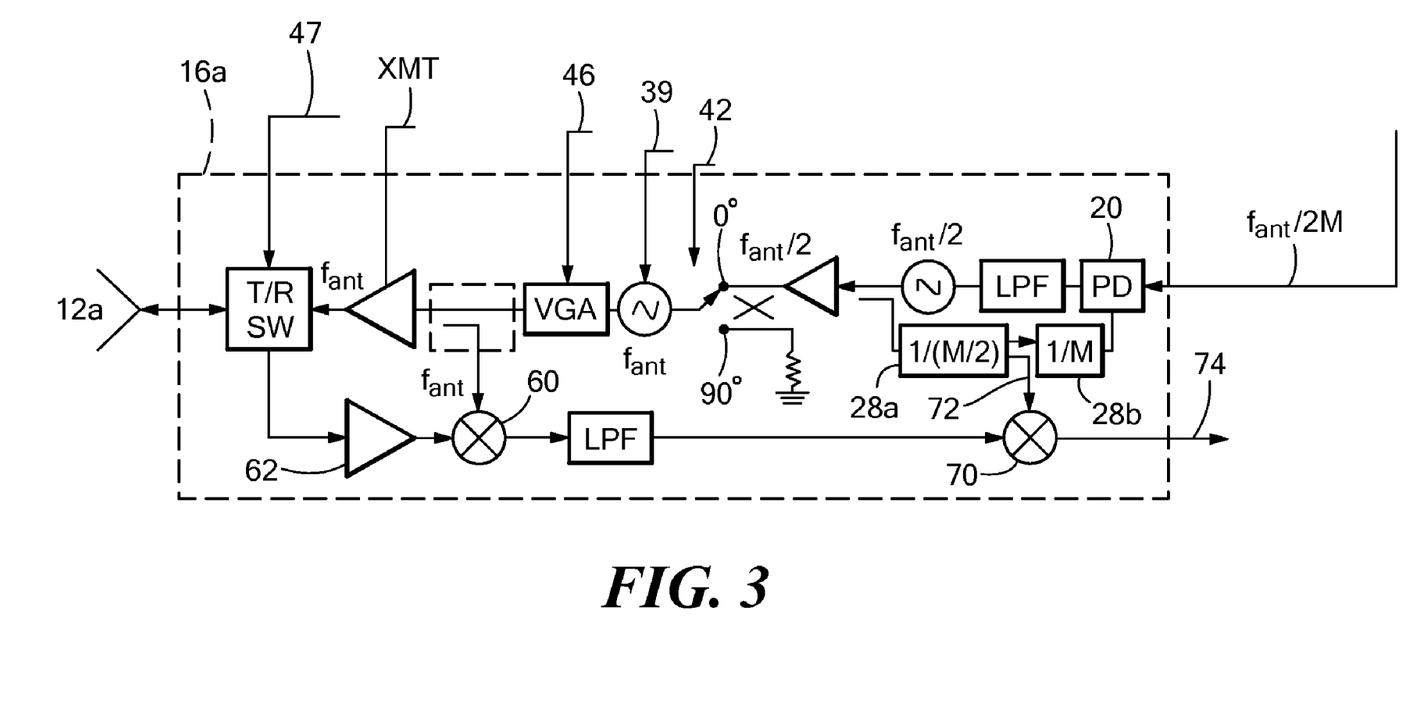
FIG. 3 is a block diagram of an exemplary one of a plurality of identical variable transmit/receive phase shifting and amplitude adjusting modules used in the radar system of FIG. 1 implemented with a plurality of integrated circuit chips.

Referring now to FIG. 3, another embodiment of a variable transmit/receive phase shifting and amplitude adjusting modules, here module 16'a. is shown. Here, the output of low pass filter 64 is fed to a mixer 70. Here, the frequency divider 28, FIH. 1, in the module 16a is replaced with a pair of dividers, 28a and 28b. The frequency divider 28a produces a signal having a frequency $f_{ant}/(M/2)$ which is fed to a second input of mixer 70 via coupler 72. The frequency divider 28b produces a signal having a frequency $f_{ant}/2$ which is fed to the phase detector 20. The output of mixer 70 thus is thereby upconverted to a frequency $f_{ant}/M$ for processing by the radar system processor 14 (FIG. 1) on line 74. Thus, the frequency produced by the receiver channel to the radar system processor 14 is different from the signal from the radar system processor 14 to the module 16', i.e., distinct from the transmit frequency reference of $f_{ant}/(2M)$.

The resulting up-conversion allows potential reuse of the UHF system/element interface which caries the original reference signal $f_{ant}/2$ to the array elements. To avoid phase pulling, care must be taken to provide isolation between the receive and the transmit UHF paths. There are a number of alternative approaches to achieving this isolation:

1. Good UHF directional couplers must be used to route the input signal on line 18 and the output signal from the mixer 70.
2. A separate receive path UHF transmission line 74 can run in parallel to the transmit reference lines 18, as shown in FIG. 3.
3. The local oscillator frequency from the feedback signal in the PLL used in the receive chain up-converter (i.e., mixer 70) can be derived from any intermediate divider stage in the master oscillator PLL, as shown. For example, taking the LO prior to the last divide-by-two stage will yield a local oscillator frequency of $f_{ant}/M$. This is distinct from the transmit frequency reference of $f_{ant}/(2M)$.
4. The baseband output of the direct conversion mixer in the receive chain can be digitized and multiplexed with the signals from other elements.
5. Modulation of light on optical fiber can be used to carry UHF signals to and from the array element.

A number of embodiments of the invention have been described. Nevertheless, it will be understood that various modifications may be made without departing from the spirit and scope of the invention. Accordingly, other embodiments are within the scope of the following claims.

What is claimed is:

1. A phase shifter, comprising:
   an input signal source having a frequency f;
   a coupler fed by the input signal, such coupler having a pair of output terminals for providing a pair of signals having the frequency f and having a relative phase difference of $m\pi/2$ radians, where m is an integer;
   a switch having a pair of inputs, each one of the pair of inputs being coupled to a corresponding one of the pair of output terminals of the coupler, such switch having an output, one of the pair of inputs of the switch being coupled to the output of the switch selectively in accordance with a first control signal fed to the switch;
   a tunable resonant circuit coupled to the output of the switch, such tunable resonant circuit having a nominal resonant frequency which is an integer multiple of the frequency f, the frequency of the resonant circuit being detuned from the nominal resonant frequency in response to a second control signal fed to the tunable resonant circuit.

2. The phase shifter recited in claim 1 including a frequency multiplier for multiplying the frequency, f/M, of a second signal by a factor M, where M is an integer, to produce the input signal having the frequency f.

3. The phase shifter recited in claim 2 wherein the frequency multiplier includes a phase locked loop, comprising:
- a phase detector having a first input fed by the second signal;
- an oscillator controlled by the phase detector for producing the input signal; and
- wherein the phase detector has a second input fed by a portion of the signal produced by the oscillator.

4. The phase shifter recited in claim 3 wherein the phase locked loop includes a frequency divider fed by the portion of the signal produced by the oscillator, such frequency divider being fed to the second input of the phase detector, such frequency divider dividing the frequency of the signal produced by the oscillator by the factor M.

5. A transmit/receive module, comprising:
(A) a transmit path having:
- a phase shifter, comprising:
  - an input signal having a frequency f;
  - a coupler fed by the input signal, such coupler having a pair of output terminals for providing a pair of signals having the frequency f and having a relative phase difference of $m\pi/2$ radians, where m is an integer;
  - a switch having a pair of inputs, each one of the pair of inputs being coupled to a corresponding one of the pair of output terminals of the coupler, such switch having an output, one of the pair of inputs of the switch being coupled to the output of the switch selectively in accordance with a first control signal fed to the switch;
  - a tunable resonant circuit coupled to the output of the switch, such tunable resonant circuit having a nominal resonant frequency which is an integer multiple of the frequency f, the frequency of the resonant circuit being detuned from the nominal resonant frequency in response to a second control signal fed to the tunable resonant circuit; and
  - wherein a transmit signal is derived from the signal produced by the tunable resonant circuit; and
(B) a receive path, comprising;
- a mixer fed by reflections of the transmit signal and a portion of the signal produced by the tunable resonant circuit.

6. A transmit/receive module, comprising:
(A) a transmit path having:
- a phase shifter, comprising:
  - an input signal having a frequency f;
  - a coupler fed by the input signal, such coupler having a pair of output terminals for providing a pair of signals having the frequency f and having a relative phase difference of $m\pi/2$ radians, where m is an integer;
  - a switch having a pair of inputs, each one of the pair of inputs being coupled to a corresponding one of the pair of output terminals of the coupler, such switch having an output, one of the pair of inputs of the switch being coupled to the output of the switch selectively in accordance with a first control signal fed to the switch;
  - a tunable resonant circuit coupled to the output of the switch, such tunable resonant circuit having a nominal resonant frequency which is an integer multiple of the frequency f, the frequency of the resonant circuit being detuned from the nominal resonant frequency in response to a second control signal fed to the tunable resonant circuit; and
  - wherein a transmit signal is derived from the signal produced by the tunable resonant circuit;
  - a frequency multiplier for multiplying the frequency, f/M, of a second signal by a factor M, where M is an integer, to produce the input signal having the frequency f; and
(B) a receive path, comprising;
- a mixer fed by reflections of the transmit signal and signal derived from the frequency multiplier.

7. The transmit/receive module of claims 6 wherein the frequency multiplier includes a phase locked loop, comprising:
- a phase detector having a first input fed by the second signal;
- an oscillator controlled by the phase detector for producing the input signal; and
- wherein the phase detector has a second input fed by a portion of the signal produced by the oscillator.

8. A phase shifter, comprising:
- a frequency multiplier for converting the frequency, f/(2M), of an input signal where M is an integer greater than one, to produce a first output signal having a frequency f/2;
- an resonant circuit coupled to the frequency multiplier for producing a second output signal having a nominal frequency nf/2, where n is an integer, the phase of the second output signal being changed from a nominal phase in response to a control signal fed to the resonant circuit;
- a coupler having a pair of outputs for providing at one output a signal having a fixed 90 degree phase difference relative to a signal at the other one of the outputs, such hybrid junction having an input coupled to the frequency multiplier;
- a switch for coupling one of the pair of outputs of the coupler to the resonant circuit selectively in accordance with a switch control signal.

\* \* \* \* \*

UNITED STATES PATENT AND TRADEMARK OFFICE
CERTIFICATE OF CORRECTION

PATENT NO. : 7,298,217 B2
APPLICATION NO. : 11/292847
DATED : November 20, 2007
INVENTOR(S) : Adlerstein et al.

It is certified that error appears in the above-identified patent and that said Letters Patent is hereby corrected as shown below:

Abstract, line 18, delete "the a harmonic" and replace with -- the harmonic --.

Col. 1, line 7, delete "system" and replace with -- systems --.

Col. 1, line 9, delete "fabrication" and replace with -- fabrications. --.

Col. 1, line 29-30, delete "beam the" and replace with -- beam, the --.

Col. 1, line 59, delete "application" and replace with -- application. --.

Col. 2, line 14, delete "the a harmonic" and replace with -- the harmonic --.

Col. 2, line 38, delete "frequency, f/(2M)," and replace with -- frequency f/(2M), --.

Col. 3, line 2, delete "frequency" and replace with -- frequency. --.

Col. 3, line 32-33, delete "invention." and replace with -- invention; --.

Col. 3, line 38, delete "chips" and replace with -- chips; --.

Col. 3, line 44, delete "FIG.1 a" and replace with -- FIG. 1, a --.

Col. 4, line 8, delete "feed back" and replace with -- feedback --.

Col. 4, line 18, delete "terminal" and replace with -- terminals --.

Col. 4, line 28, delete "state the" and replace with -- state, the --.

Col. 4, line 39, delete "that tunable" and replace with -- that the tunable --.

Col. 4, line 40, delete "such parallel" and replace with -- such as a parallel --.

Col. 4, line 49, delete "though" and replace with -- through --.

Col. 5, line 10, delete ", slave, 38," and replace with -- , slave 38, --.

Col. 5, line 14, delete ", slave, 38 the" and replace with -- , slave 38, the --.

UNITED STATES PATENT AND TRADEMARK OFFICE
CERTIFICATE OF CORRECTION

PATENT NO. : 7,298,217 B2
APPLICATION NO. : 11/292847
DATED : November 20, 2007
INVENTOR(S) : Adlerstein et al.

It is certified that error appears in the above-identified patent and that said Letters Patent is hereby corrected as shown below:

Col. 5, line 29, delete "16a-16" and replace with -- 16a-16n --.

Col. 6, line 58, delete "sub harmonic" and replace with -- subharmonic --.

Col. 7, line 4, delete "array what" and replace with -- array, what --.

Col. 7, line 15, delete ", not shown has a phase shift is 2X" and replace with -- , not shown, has a phase shift 2X --.

Col. 7, line 31, delete "module" and replace with -- modules --.

Col. 7, line 35, delete "Hence the" and replace with -- Hence, the --.

Col. 7, line 38, delete "module" and replace with -- modules --.

Col. 7, line 57, delete "beam former" and replace with -- beamformer --.

Col. 7, line 66, delete "FIH.1," and replace with -- FIG. 1, --.

Col. 8, line 13, delete "caries" and replace with -- carries --.

Col. 10, line 23, delete "signal" and replace with -- the signal --.

Col. 10, line 24, delete "claims 6" and replace with -- claim 6 --.

Signed and Sealed this

Twenty-second Day of July, 2008

JON W. DUDAS
*Director of the United States Patent and Trademark Office*